United States Patent [19]

Baldwin

[11] 3,786,493

[45] Jan. 15, 1974

[54] ANALOG TO DIGITAL CONVERTER USING A DRIFT TRANSISTOR

[75] Inventor: Gary Lee Baldwin, Sea Girt, N.J.

[73] Assignee: Bell Telephone Laboratories Incorporated, Murray Hill, N.J.

[22] Filed: Aug. 10, 1972

[21] Appl. No.: 279,745

[52] U.S. Cl........ 340/347 AD, 307/229, 307/299 B, 317/235 Z

[51] Int. Cl.......................... G08c 5/00, H03k 13/00

[58] Field of Search............................ 307/229, 299; 317/235 Z; 340/347 AD

[56] References Cited

UNITED STATES PATENTS

| | | | |
|---|---|---|---|
| 2,941,092 | 6/1960 | Harrick | 307/299 X |
| 2,992,337 | 7/1961 | Rutz | 307/299 X |
| 3,252,063 | 5/1966 | Ziffer | 317/235 Z |
| 3,416,152 | 12/1968 | Trilling | 340/347 |
| 3,553,677 | 1/1971 | Cattermole | 340/347 AD |
| 3,560,963 | 2/1971 | Trilling | 340/347 |

OTHER PUBLICATIONS

"Solid State Analog-To-Digital Converter" by Putzrath in RCA Technical Notes RCA T.N. No. 465, Sept. 1961, pages (2 sheets, 1 and 2)

*Primary Examiner*—Stanley D. Miller, Jr.
*Attorney*—W. L. Keefauver

[57] ABSTRACT

A device is described for converting an analog signal into an equivalent digital representation thereof. A single drift transistor having a plurality of collectors, a base with dual contacts, and a single emitter is operated to effect the conversion a word at a time. The drift field is established by the analog signal to be encoded as it is applied differentially to the dual base. When a pulse of charged carriers is injected into the emitter, the pulse travels through the semiconductor material to at least one of the collectors. By employing a fixed sampling time and by arranging the plurality of collectors in the form of a binary code matrix, the digital representation of the applied analog signal is obtained in the single step inherent in word-at-a-time encoders.

10 Claims, 5 Drawing Figures

ANALOG TO DIGITAL CONVERTER USING A DRIFT TRANSISTOR

BACKGROUND OF THE INVENTION

1. Field of the Invention

This invention relates to solid state analog-to-digital converters and, in particular, to those semi-conductor converters which effect such conversion a word at a time.

2. Description of the Prior Art

For the past several years, there has been an ever increasing demand for digital communications facilities for the transmission of voice and video signals. Since these signals originate in analog form, it becomes necessary to provide some form of interface device which will perform the required conversion. Such a device is termed an analog-to-digital converter (A/D converter).

The concept of A/D converters is fairly well understood; and as a result, numerous designs have been implemented. The early discrete component varieties required numerous precision reference voltages, accurate comparison circuits, and digital code generators. These devices were physically large in size, required a considerable amount of power for operation, had inherent stability problems, and operated at low speed. In addition, these circuits generated the digital code a bit at a time making extensive use of feedback techniques to effect this type of operation. These designs were complex, expensive, and somewhat unreliable due to the numerous circuit components required for implementation.

With the advent of low cost, functional integrated circuits, the complexity in terms of individual transistors, diodes, resistors, and capacitors has become less important; but the overall design complexity remains. The cost has been somewhat reduced along with the physical size. Reliability has been greatly improved. However, the speed of operation is still limited because of the bit-by-bit encoding technique. Feedback techniques are still widely employed, and the need for accurate reference voltages has not been abated. Power consumption has been reduced but not to the point where large quantities of devices can be operated from a single power supply.

Accordingly, one object of the present invention is to increase the encoding speed of an analog-to-digital converter.

Another object is to reduce the amount of power required to operate high-speed analog-to-digital converters.

Still another object is to reduce the physical size of the device used to effect an analog-to-digital conversion.

Still another object is to eliminate the requirement for precision reference voltages.

A still further object is to simplify the design of an analog-to-digital converter.

SUMMARY OF THE INVENTION

The foregoing and other objects of the invention are realized in an illustrative embodiment wherein the analog signal to be encoded is applied differentially to two separate base contacts of a single drift transistor. This analog signal establishes within the semiconductor material an electric drift field which is directly proportional thereto. By injecting a pulse of charged carriers into the single emitter of the drift transistor, the pulse, under the influence of the established drift field, travels through the semiconductor material to at least one of a plurality of collectors. By employing a fixed sampling time and by arranging the plurality of collectors in the form of a binary code matrix, the digital representation of the applied analog signal is thereby obtained in a single step.

Accordingly, it is one feature of the present invention that a single semiconductor device is used to effect an analog-to-digital conversion.

Another feature of the invention is that the analog-to-digital encoding is effected a word at a time, as contrasted to a bit at a time encoding.

Another feature of the invention is that the fixed sampling time permits pulsed collector operation, thereby reducing the amount of power consumption.

Still another feature of the invention is that the direct word-at-a-time encoding eliminates the need for feedback-type operation.

Still another feature of the invention is that the simplified design results in an improvement of the overall converter reliability.

BRIEF DESCRIPTION OF THE DRAWINGS

The aforementioned features and objects of the invention, as well as other features and objects, will be better understood upon a consideration of the following detailed description and the appended claims in connection with the attached drawings of an illustrative embodiment in which:

DETAILED DESCRIPTION

Before giving the complete detailed description of the analog-to-digital converter, it will be helpful to have an understanding of an early experiment entitled *The Mobility and Life of Injected Holes and Electrons in Germanium* conducted by J. R. Haynes and W. Shockley that was reported in *Physical Review*, Volume 81, No. 5, Mar. 1, 1951, pages 835 through 843. In that experiment, a drift field was impressed upon a bar of semiconducting material and a pulse of charged carriers was injected into one end of the bar. After some delay, the shape of the injected pulse was observed at a point along the length of the bar. By observing the changing shape of the pulse, information concerning the recombination times and carrier mobilities could be ascertained.

Figure 1:
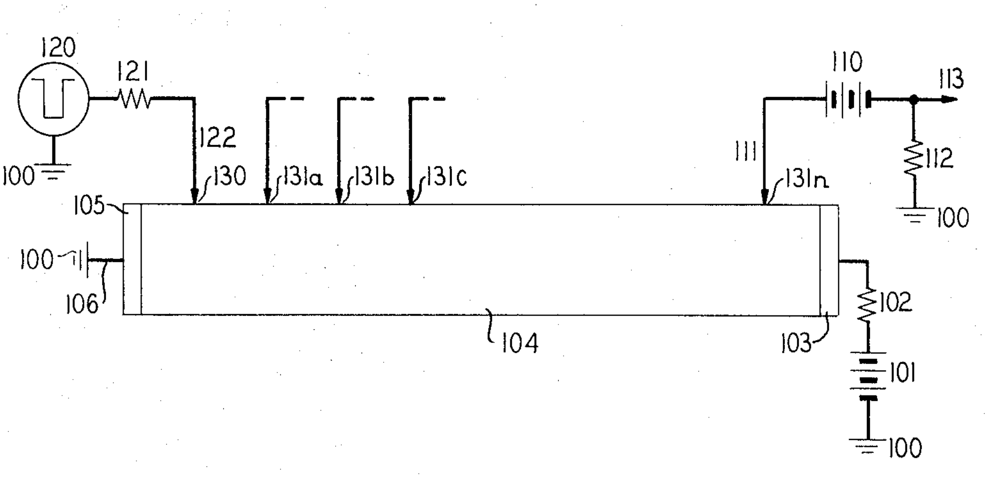
FIG. 1 is a simplified schematic representation of an analog-to-digital converter which utilizes a drift electric field in a bar of semiconductor material.

If this same basic experimental approach is considered from a somewhat different point of view, the establishment of a drift field in semiconductor material can be advantageously employed for effecting the conversion of an analog signal into its equivalent digital representation. FIG. 1 illustrates a simplified version of an analog-to-digital converter utilizing a drift field. The analog voltage to be converted is supplied by a source herein represented in the simplified version of the device by battery 101. Battery 101 and resistor 102 are connected in series beteween ground 100 and ohmic contact 103 on one end of silicon bar 104. The opposite end of silicon bar 104 is terminated in ohmic contact 105 and is connected to ground 100 through circuit 106. The battery 101 and resistor 102 in series connection therewith establish a continuous flow of majority carriers which flows from ohmic contact 103 through silicon bar 104 to ohmic contact 105 and thence to ground 100. If one prefers, the alternate description of current flow in terms of minority carriers can be considered. Using this approach, the minority carriers flow from ohmic contact 105 through silicon bar 104 to ohmic contact 103. Whether current flow in terms of majority or minority carriers is preferred, the end result is the establishment of a drift electric field directed from ohmic contact 103 to ohmic contact 105. Since battery 101 provides a constant source of d.c. potential, the drift electric field in silicon bar 104 is also constant.

Figure 2:
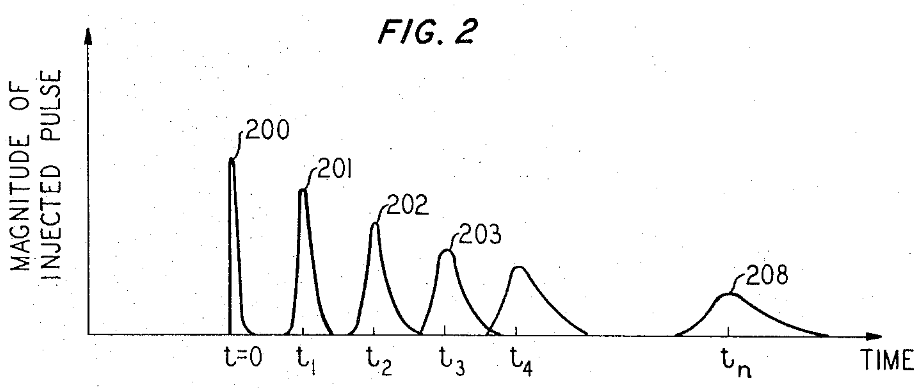
FIG. 2 is a time history of an injected pulse of charged carriers as that pulse travels along the length of a bar of semiconductor material.

A pulsed voltage source 120 is connected in series with resistor 121 through circuit 122 to silicon bar 104 at point 130. With voltage source 120 configured so as to step periodically between a reference ground potential and a predetermined negative voltage, a pulse of minority carriers is injected into silicon bar 104. The injected pulse of minority carriers has a shape and amplitude similar to the pulse 200 shown in FIG. 2 at time $t = 0$. Under the influence of the drift electric field, this pulse of minority carriers travels along the length of silicon bar 104 to one of a plurality of detection points illustrated by contact points 131a through 131n in FIG. 1.

By means of suitable detection circuitry herein comprised of voltage source 110 in series with movable contact circuit 111 and output point 113, with resistor 112 connected across output point 113 and ground 100, the amplitude of the injected pulse of minority carriers can be detected at any point along the length of the silicon bar 104. With movable contact circuit 111 at point 131a on silicon bar 104 the amplitude and shape of the detected pulse is similar to the pulse 201 shown in FIG. 2 centered about time $t_1$. It should be noted that the pulse amplitude has decreased and that the shape has broadened. These effects result from the diffusion and recombination of the injected minority carriers as the pulse travels along the length of silicon bar 104. With movable contact circuit 111 at detection point 131*b*, the detected pulse of minority carriers has the amplitude and shape illustrated by the pulse 202 in FIG. 2. The detection of the pulse of minority carriers at point 131*c* yields a pulse 203 which is further reduced in amplitude and broadened in width. Finally, detecting the injected pulse at point 131*n* results in a pulse 208 which barely resembles the original pulse.

In the absence of fluctuations of charge mobility and with a constant electric field, the position of detection of the injected pulse of charged carriers is directly proportional to the time of observation. By fixing the time of observation of the minority carrier pulse and by changing the source of drift electric field from a constant to a variable source, the position of the pulse of charged carriers along silicon bar 104 at the fixed sampling time is linearly related to the drift field. Attaching a plurality of detectors at discrete positions 131*a* through 131*n* along the silicon bar 104, the voltage which creates the drift electric field is quantized by associating a unique digital code with each position thereby effecting the analog-to-digital conversion a word at a time.

Figure 3:
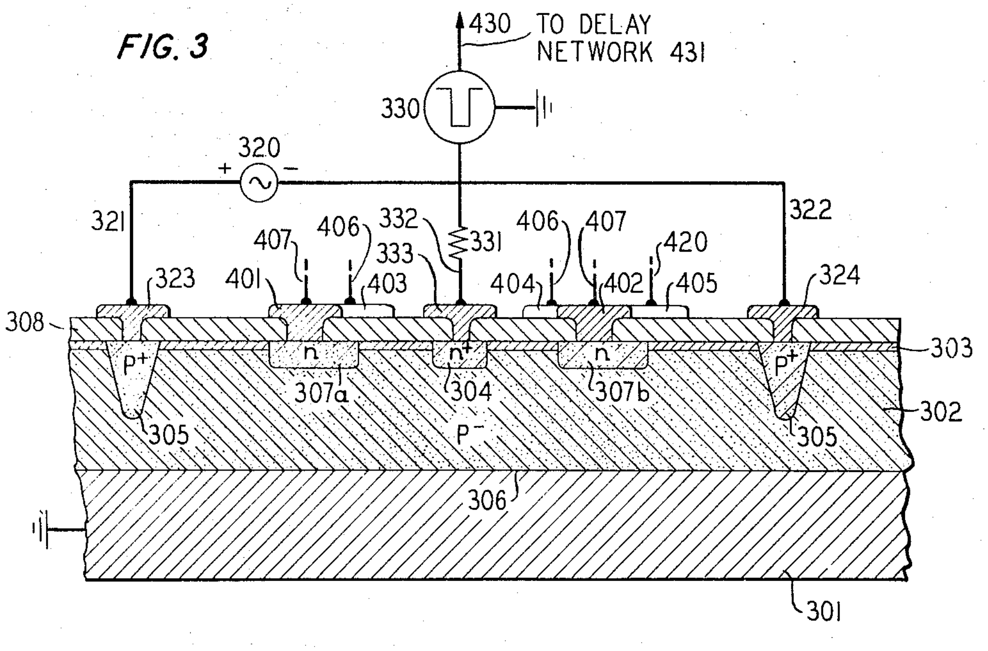
FIG. 3 is a cross-sectional view of the preferred embodiment of the present invention.
Figure 4:
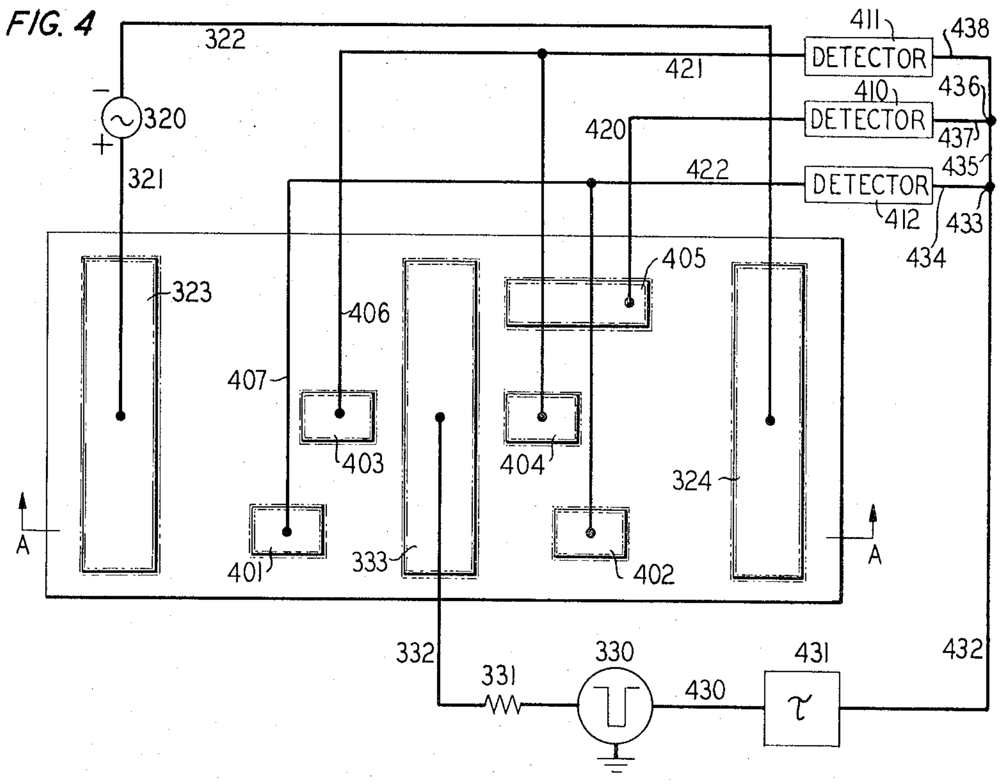
FIG. 4 is a top view of the preferred embodiment of the present invention.

With the description of the foregoing simplified version in mind, it will be somewhat easier to describe the preferred embodiment of the analog-to-digital converter illustrated in FIGS. 3 and 4. It is to be understood that while the following description is framed in terms of an npn-type of transistor structure, a pnp-type of structure can be equally considered by the interchange of dopings and polarities of the applied signals.

FIG. 3 illustrates a cross-sectional view of the preferred embodiment at section A—A of FIG. 4, the structure of which may be considered an npn transistor with a plurality of collectors and a dual base. Onto a $p$-type semiconductor substrate 301 is deposited a $p^-$-type epitaxial layer 302 which forms the base of the transistor. A $p^+$ layer 303 is placed atop epitaxial layer 302 by ion implantation techniques. Into the $p^-$-type epitaxial layer 302 and the $p^+$ layer 303 is diffused a unitary strip of $n^+$-type material. This diffusion of $n^+$-type material forms the emitter region 304 of the device. Spaced equidistant from the emitter region 304 are two $p^+$regions 305 which form the dual base contacts.

The $p^+$-type material of layer 303 and the substrate 301, which is grounded, set up a vertical retarding field which tends to establish a channel for the electrons in the central portion of the epitaxial layer 302. This channel is oriented parallel to the epitaxial-substrate interface 306. The channeling of electrons retards the minority carriers from being recombined at the surface of the device thereby lengthening the effective minority carrier lifetime. In addition, the channeling of electrons permits a maximum emitter injection efficiency into the center of the epitaxial layer 302 toward the epitaxial-substrate interface 306.

Spaced in the form of a Gray code matrix between the $n^+$ emitter region 304 and the dual $p^+$ base contacts 305 are a plurality of $n$-type collector regions 307*a* through 307*e*, more completely shown in FIG. 4. Collector regions 307*a* through 307*e* are diffused into epitaxial layer 302 and $p^+$ layer 303 in the form of stripes. Over the surface of the device is deposited oxide layer 308. A plurality of metallized aluminum layers 401 through 405, more clearly shown in FIG. 4, are deposited on the collector regions 307*a* through 307*e*, respectively.

For the embodiment illustrated, the Gray code matrix reduces to a two-bit code plus a third bit for a sign indication. An output detected on collector 307*e* will yield a positive sign as the most significant bit. Collectors 307*c* and 307*d* are coupled by circuit 406 and are symmetric about emitter region 304. Output indications at metallized layers 403 and 404 yield the next most significant bit in the Gray code. An output on metallized layer 404 corresponds to a positive next most significant bit while an output on metallized layer 403 corresponds to a negative next most significant bit. The absolute magnitude of the signal represented by the Gray code would be the same in either case, the only difference being in the sign attached to the quantity.

The least significant bit is determined by detecting the outputs of collectors 307*a* and 307*b* coupled by circuit 407. As was the case for the next most significant bit, the Gray code representation of the signal, whether detected at metallized layer 401 or 402, would be the same with the exception of the sign associated therewith.

It should be noted that there is no direct correspondence between the signal magnitude and the binary value represented by the Gray code. For example, an output detected only on collectors 307*d* and 307*e* represents an analog signal having the smallest positive magnitude even though the corresponding Gray code representation is 6 in binary. An output only on collector 307*a* corresponds to the second largest negative analog signal level even though symbolized by a Gray code representation of 1 in binary. Consequently, a code conversion step (not shown) must follow the analog-to-digital conversion to put the digital representation in the customary binary format. In order to maintain uniform power requirements, the metallized areas of the interconnected collector regions 307 are made equal, such that, for example, the area of metallized layers 401 and 402 covering collectors 307*a* and 307*b* is equal to the area of metallized layers 403 and 404 covering collectors 307*c* and 307*d*, and is also equal to the area of metallized layer 405.

Source 320 which supplies the analog signal to be digitally encoded is connected differentially to the metallized layers 323 and 324 of the dual base contacts 305 through circuits 321 and 322, respectively. The analog voltage from source 320 establishes within the epitaxial layer 302 a drift electric field.

Pulse source 330 is serially connected to a resistive impedance 331. Source 330 and resistive impedance 331 connect through circuit 332 to metallized layer 333 deposited on emitter region 304. When pulse source 330 generates a voltage pulse going from a reference ground potential to a predetermined negative voltage, a pulse of minority carriers is injected through the $n^+$ emitter region 304. These minority carriers drift down the epitaxial layer 302 under the influence of the electric field supplied by source 320 and are collected in at least one of the collectors 307 at a fixed sampling time. The direction and velocity of the minority carriers, as they drift through epitaxial layer 302, is a function of the polarity and amplitude of the signal supplied by source 320. Pulse source 330 must operate at a rate of at least twice that of the highest frequency component present in the signal from source 320.

It is desirable that the collectors 307 have little influence on the behavior of the pulse of injected minority carriers in the epitaxial region 302 until the sampling time is reached. Consequently, prior to the sampling time the collectors 307 appear as open circuits. At the sampling time the collectors 307 are returned to a voltage sufficiently high to attract the minority carriers. This voltage must exceed the maximum potential supplied by source 320. The minority carriers exit from epitaxial layer 302 through a collector located above the position proportional to the drift field induced by the applied analog voltage supplied by source 320. The minority carriers exiting from the epitaxial region 302 cause a negative voltage to appear to the collector node having a code corresponding to the quantized input from source 320.

Collectors 307 are arranged into a Gray binary code matrix, as indicated above. The most significant bit of the digitally encoded signal is determined by detecting the pulse of injected minority carriers at collector 307*e*. Minority carrier pulse detection is effected by detector 410 which is connected to metallized layer 405 through electric circuit 420. The circuit grounds for detectors 410 through 412 are included within the schematic representation of the detectors as shown in FIG. 4. The next most significant bit of the digital signal is determined by detecting the pulse of injected minority carriers at collectors 307*c* and 307*d*. Detection of the pulse of minority carriers at these collectors is effected by detector 411. Detector 411 connects to collectors 307*c* and 307*d* through electric circuits 421 and 406 attached to metallized layers 403 and 404. The least significant bit, in the embodiment illustrated in FIGS. 3 and 4, is determined by detecting the injected pulse of minority carriers on collectors 307*a* and 307*b*, which are connected to detector 412 through electric circuits 422 and 407 and metallized layers 401 and 402. Detectors 410 through 412 are of the same circuit type.

Detectors 410 through 412 are pulsed on by source 330 after a time delay which corresponds to the maximum transit time of the pulse of minority carriers as it travels through epitaxial region 302 to the outermost collector either 307*a* or 307*e*. A second output from source 330 is connected to delay network 431 through circuit 430. Circuit 432 connects the output of delay network 431 to circuit node 433. Detector 412 connects to node 433 through circuit 434. Circuit 435 connects node 433 to node 436. Detector 410 connects to node 436 through circuit 437, while detector 411 connects to node 436 through circuit 438. By simultaneously pulsing on detectors 410 through 412, the analog-to-digital conversion is effected a word at a time.

The collector arrangement as described corresponds to a Gray-code pattern. With the array of collector stripes, as shown in FIG. 4, eight coded positions are defined and a three-bit code is generated. Higher order bit codes can be generated, limited only by the recombination and diffusion effects which cause pulse spreading and, in the limit, by the spacing of adjacent collector stripes realizable with photolithographic techniques. The pulse spreading effects, as related to the number of bits that can be encoded, can be compensated by setting the threshold of the detection circuitry to a higher value. By so doing, the defined collector regions can be placed closer to one another, but, as indicated, only as close as physically realizable by photolithographic techniques.

Figure 5:
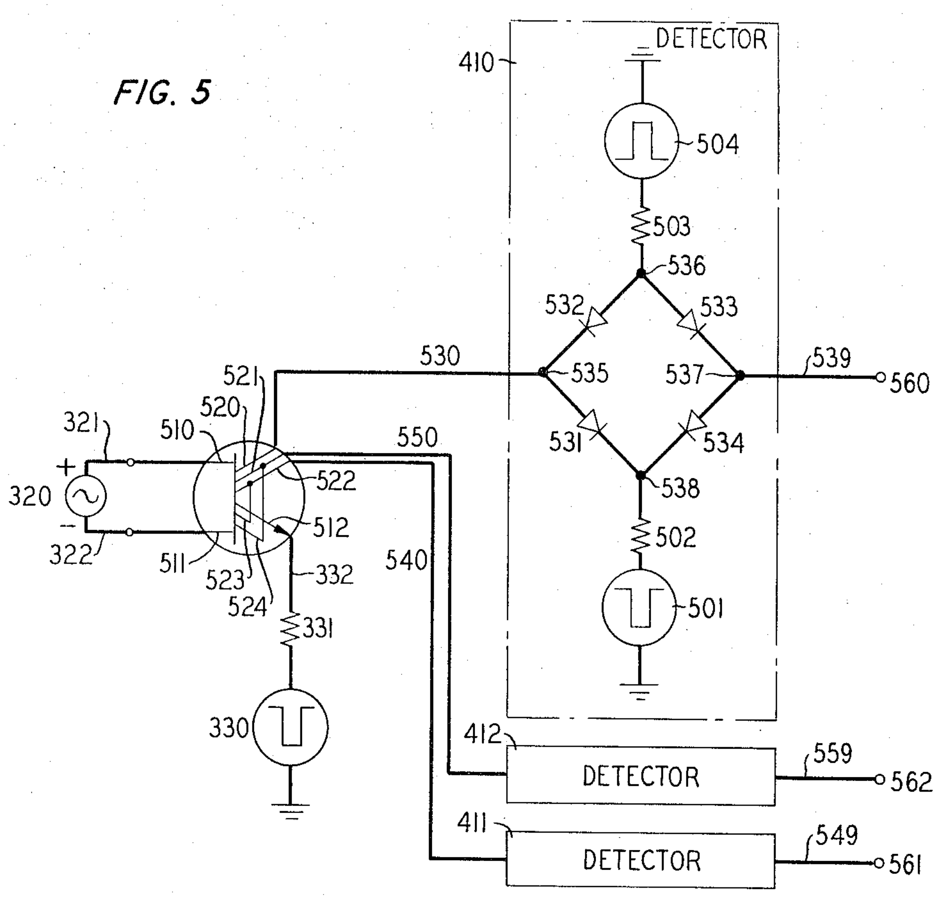
FIG. 5 is an equivalent circuit representation of the preferred embodiment of the present invention.

FIG. 5 illustrates the equivalent circuit of the analog-to-digital converter. As indicated previously, the preferred embodiment can be considered as an npn transistor having dual base terminals 510 and 511, a single emitter terminal 512 and a plurality of collector terminals 520 through 524. A pnp embodiment of the device can be realized by reversing all of the polarities and dopings from those shown in FIG. 3.

In the equivalent circuit of FIG. 5, analog signal source 320 is differentially connected to dual base terminals 510 and 511 through electric circuits 321 and 322, respectively. As the potential of source 320 varies in accordance with the analog signal to be encoded, the drift electric field established within the epitaxial layer 302 of the device varies proportionally. A pulse of minority carriers is generated by source 330 in series connection with resistor 331. This pulse of minority carriers is injected into emitter terminal 512 through electric circuit 332. The pulse of minority carriers drifts through the epitaxial layer 302 under control of the electric field across base terminals 510 and 511 until collected by at least one of the collectors 520 through 524.

Collector 520 is connected to current detector 410 by circuit 530 (corresponding to circuit 420) and thereby provides the circuitry for ascertaining the most significant bit in the three-bit code of the illustrated embodiment. Similarly, interconnecting collectors 522 and 523 by circuit 540 (corresponding to circuits 406 and 421) provide the next most significant bit. The least significant bit is determined by connecting collectors 521 and 524 together by circuit 550 (corresponding to circuits 407 and 422).

Current detector 410, which connects to most significant bit lead 520, is comprised of diodes 531 through 534, pulse sources 501 and 504 and resistors 502 and 503. Pulse source 501 is schematically equivalent to the output of source 330 through delay network 431 and all of the interconnecting circuitry 432 through 438 shown most clearly in FIG. 4, and not repeated in FIG. 5 for the sake of clarity of expression. Pulse source 504 is shown schematically independent of source 330, since source 504 delivers a positive going pulse having an absolute magnitude larger than that of source 501 which is derived from source 330 after a suitable delay. Because the pulses from sources 501 and 504 occur in time coincidence, the positive going pulse of source 504 is advantageously derived from source 330, by circuits not shown, by splitting the signal out of delay network 431 and inverting and amplifying the one signal with respect to the other. The signal from source 504 must have an absolute magnitude greater than that from source 501 and be of opposite polarity in order to reverse bias the collector-base junction with respect to collector 520 during the sampling interval. In order to more clearly show the analog-to-digital converter, this detail of the detector structure has been omitted from FIG. 4.

The cathode of diode 532 and the anode of diode 531 are connected together at node 535 along with most significant bit lead 530. Positive pulse source 504 in series connection with resistor 503 connects to node 536. The anodes of diodes 532 and 533 also connect to node 536. The cathode of diode 533 and the anode of diode 534 interconnect at node 537. Node 537 connects through circuit 539 to most significant bit output 560. The cathodes of diodes 531 and 534 are connected at node 538. Pulse source 501 in series connection with resistor 502 also connects to node 538.

With the outputs of pulse sources 501 and 504 at the reference signal level, diodes 531 through 534 are nonconducting and thereby present a high impedance to collector 520. At the sampling time, the output of pulse source 501 goes negative, while the output pulse of source 504 simultaneously goes positive, forward biasing diodes 531 through 534 and causing them to become conductive. Diodes 531 through 534 in a conductive state present a low impedance to collector 520 and any signal thereon is coupled by circuit 530 through the diodes to circuit 539 and most significant bit output 560. After sampling, the output signals from pulse sources 501 and 504 return to the reference level and diodes 531 through 534 again become nonconductive presenting a high impedance to collector 520.

The next most significant bit is provided at output 561 through circuit 549 which connects current detector 411 and interconnecting circuit 540 to collectors 522 and 523. The least significant bit appears at output 562 when current detector 412 is energized, thereby coupling the signal on either of collectors 521 or 524 through interconnecting circuit 550 and circuit 559.

By energizing current detectors 410, 411, and 412 simultaneously, the analog-to-digital conversion is effected a word at a time. With word-at-a-time encoding, the speed of conversion is significantly increased. The periodic injection of the pulse of charged carriers and the periodic sampling of the plurality of collectors substantially reduces the amount of power required for operation. In addition, the arrangement of collectors 520 through 524 in accordance with a binary code matrix eliminates the need for any precision reference voltage sources. Because a single device is used to effect the encoding, the reliability of the converter is greatly improved over prior art encoders.

Although the present invention has been described in connection with a particular embodiment thereof, further embodiments and modifications which will be apparent to those skilled in the art are included within the scope and spirit of the invention.

What is claimed is:

1. A combination for converting a variable amplitude analog signal to a digital signal comprised of a transistor having a single emitter contact, dual base contacts and a plurality of collector contacts, means for impressing said variable amplitude analog signal on said dual base contacts to establish a drift electric field, means for injecting a pulse of charged carriers on said emitter contact, and means for detecting the spatial position of said pulse of charged carriers a fixed time interval after injection of said pulse of charged carriers on at least one of said collector contacts with said detected spatial position being proportional to said drift electric field to provide a digitally encoded signal indicative of said variable amplitude analog signal.

2. The combination in accordance with claim 1 wherein the means for impressing the analog signal on the dual base contacts comprises first and second base region contacts equidistant from said single emitter contact, metallized layers deposited on the exterior surface of said base region contacts, and first and second electric circuits connecting said analog signal differentially to said metallized layers of said base region contacts.

3. The combination in accordance with claim 1 wherein the means for injecting a pulse of charged carriers on the emitter contact comprises a unitary emitter region, a metallized layer deposited on the exterior surface of said emitter region contact, means for generating a pulse of minority carriers, and means for connecting said minority carrier pulse generating means to said metallized layer of said emitter region contact.

4. The combination in accordance with claim 3 wherein the means for generating a pulse of minority carriers comprises a voltage source having an output which periodically steps between a reference ground potential and a predetermined voltage, and a resistive impedance in series connection with said voltage source and said connecting means.

5. The combination in accordance with claim 1 wherein the means for detecting the pulse of charged carriers comprises a plurality of current detecting means, means for connecting said current detecting means to said collector contacts, and means for periodically activating said current detecting means.

6. The combination in accordance with claim 5 wherein each of the current detecting means comprises means for periodically generating a sampling bias current, a common ground reference, and a diode bridge rectifier circuit in the bidirectional current path of at least one of said collectors with the diodes poled for forward conduction of said bias current as it flows between said generating means and said common ground reference.

7. The combination in accordance with claim 5 in which said plurality of collector region contacts of said transistor inclues interconnection means for coupling equal areas of said collector region contacts to each of said current detecting means.

8. The combination in accordance with claim 7 in which the interconnection means comprises a metallized layer deposited on the exterior surface of said collector region contacts whereby said metallized layers form a binary code matrix.

9. The combination in accordance with claim 1 in which said emitter is centrally located between said dual base region contacts, and said plurality of collector contacts are located on either side of said emitter contact and between said dual base region contacts with said collector contacts being further arranged in a binary coded matrix for cooperating with said detection means to indicate the position of said pulse of charged carriers in said transistor after said fixed time interval.

10. A semiconductor transistor device for converting a variable amplitude analog signal to a multibit digital signal a word at a time comprised of first and second base region contacts, an emitter region contact centrally located between said base region contacts, and a plurality of collector contacts on either side of said emitter region contact and between said base region contacts said collector contacts being further arranged in a binary coded matrix for effecting word-at-a-time conversions, said plurality of collectors in said binary coded matrix being disposed along plural row lines of said matrix whereas said base region contacts and said emitter region contact are parallel to column lines of said matrix, with the presence or absence of collector contacts along plural column lines indicating a binary representation of distance from said emitter contact, the presence of a collector contact representing a binary one the absence of a collector contact representing a binary zero.

* * * * *